(12) United States Patent
Sweegers et al.

(10) Patent No.: US 10,553,766 B2
(45) Date of Patent: Feb. 4, 2020

(54) METHOD OF MANUFACTURING AN LED MODULE

(71) Applicant: LUMILEDS HOLDING B.V., Schiphol (NL)

(72) Inventors: Norbertus Antonius Maria Sweegers, Leirop (NL); Floris Maria Hermansz Crompvoets, Bunde (NL); Christian Kleijnen, Ell (DE); Gerard Kums, Molenstede (NL)

(73) Assignee: LUMILEDS HOLDING B.V., Schiphol (NL)

( * ) Notice: Subject to any disclaimer, the term of this patent is extended or adjusted under 35 U.S.C. 154(b) by 0 days.

(21) Appl. No.: 16/084,453

(22) PCT Filed: Mar. 7, 2017

(86) PCT No.: PCT/EP2017/055246
§ 371 (c)(1),
(2) Date: Sep. 12, 2018

(87) PCT Pub. No.: WO2017/157719
PCT Pub. Date: Sep. 21, 2017

(65) Prior Publication Data
US 2019/0088836 A1    Mar. 21, 2019

(30) Foreign Application Priority Data
Mar. 16, 2016    (EP) ..................................... 16160678

(51) Int. Cl.
*H01L 33/54*    (2010.01)
*H01L 25/075*    (2006.01)

(52) U.S. Cl.
CPC .......... *H01L 33/54* (2013.01); *H01L 25/0753* (2013.01); *H01L 2933/0091* (2013.01)

(58) Field of Classification Search
CPC ......... H01L 25/0753; H01L 2933/0091; H01L 33/54
USPC .......................................................... 257/98
See application file for complete search history.

(56) References Cited

U.S. PATENT DOCUMENTS

2004/0239243 A1* 12/2004 Roberts ..................... B60L 1/14
                                                          313/512
2011/0294389 A1  12/2011 Kim
2011/0316006 A1  12/2011 Ku
(Continued)

FOREIGN PATENT DOCUMENTS

DE    102013106689 A1    12/2014

*Primary Examiner* — Long K Tran
(74) *Attorney, Agent, or Firm* — Volpe and Koenig, P.C.

(57) ABSTRACT

The invention describes a method of manufacturing an LED module, comprising the steps of providing a translucent encapsulant comprising a number of layers to enclose a number of LEDs of the LED module; modifying the surface structure of an outer surface of a layer to form at least one dense scattering region corresponding to the position of an LED of the LED module; to form at least one sparse scattering region that does not correspond to the position of an LED of the LED module; and to form a transition scattering region between a dense scattering region and a sparse scattering region. The invention further describes an LED module, and a device comprising a device housing and at least one such LED module.

4 Claims, 4 Drawing Sheets

(56) References Cited

U.S. PATENT DOCUMENTS

2014/0117396 A1\* 5/2014 Eisert ................. H01L 33/44
257/98
2014/0160752 A1\* 6/2014 Cornelissen ........ H01L 25/0753
362/235

\* cited by examiner

A-A

METHOD OF MANUFACTURING AN LED MODULE

FIELD OF THE INVENTION

The invention describes a method of manufacturing an LED module; an LED module; and a device incorporating such an LED module.

BACKGROUND OF THE INVENTION

Light-emitting diodes are used in a wide variety of applications. Specifically, high-power LEDs are finding widespread used in retrofit lamps; in automotive lighting modules such as daytime running lights, brake lights and indicator lights, etc. For linear lighting modules consisting of an array or series of individual LEDs positioned at a certain pitch, regions of concentrated high luminance light are observed when looking at the light source. This "spottiness" is due to the brightness of each LED and the necessary pitch between the LEDs, and is generally perceived as undesirable. Various approaches have been tried in order to obtain the appearance of a homogeneous light source when the light source in fact includes multiple LEDs. For example, a phosphor layer can reduce the inhomogeneity of the apparent light source. Alternatively, it is known to use optical scattering elements to diffuse the light originating from the LEDs. For example, scattering particles can be suspended in a translucent encapsulant layer close to the LED dies, in a further translucent layer over an encapsulant layer, or even at a remote position from the LEDs. Scattering can also be achieved by arranging a suitably treated glass cover or polymer foil about the LED module.

In another approach, the glare of the individual LEDs can be tempered by means of a functional scattering layer that is essentially transparent, but also contains elements that reflect and/or deflect the light, for example titanium dioxide particles, or trapped air bubbles. It is also possible to suspend transparent materials with a high refractive index in an encapsulant layer, for example fillers such as glass or polymer spheres. The concentration of the scattering agent—which can comprise particles, refractive glass spheres, air bubbles etc.—to obtain a desired effect will depend on various factors such as the light emitting surface area of the LED, the LED pitch, the light escape angle, the amount of lumens emitted by the LED, the optical path of the light rays, etc. For mid-power and high-power LED applications, a translucent layer is generally made of a clear silicone product such as polydimethylsiloxane. Such silicones retain their transparency over time, and their flexible rubber-like properties make them the preferred choice for flexible LED modules. The silicone is available as a two-component product, which must be prepared by thoroughly mixing both components. Scattering agents are added at the mixing stage. The prepared mixture is then poured into a mould and then cured. Using the known approaches, it is generally only possible to obtain scattering layers in which the scattering agents are more or less evenly distributed throughout the translucent material, but the LED light sources each have a local presence in the LED module. Since the scattering agent concentration must be chosen to provide the desired degree of scattering in the region optically close to an LED, the disadvantage of the known approaches is the unnecessary loss of light in any region that is not in the direct vicinity of an LED—for example regions between LEDs of an array, regions along the outer edges of an LED module, etc.

Another disadvantage of the known approaches is that a scattering agent such as titanium dioxide reduces the flexibility of the silicone encapsulant. In addition to the problems mentioned above, such an approach would therefore not be suited for a flexible LED module. Another problem associated with the filled silicone scattering layers described above is that these must be defined or configured early on in the design stage due to the requirements of the encapsulating process, essentially ruling out any late-stage adjustment of a silicone diffuser. The use of a diffuser foil is also not suited to flexible LED lighting solutions since a foil are not truly flexible in all directions.

DE 10 2013 106 689 A1 discloses a semiconductor part comprising a single LED embedded in an opening in a mould and covered by an rigid optical plate. The optical plate is profiled, which profile has a reflectivity that from above the LED decreases outward.

US 2014/160752 A1 discloses a light output device with a number of LEDs and an adhesion layer having portions over the LEDs. Electrically scattering particles adhere by electrostatic attraction to the adhesion layer portions, forming scattering regions that are self-aligned to the light emitting device. Between the LEDs the particle layer may be thinner.

It is an object of the invention to provide an improved LED module that overcomes the problems described above.

SUMMARY OF THE INVENTION

The object of the invention is achieved by the method of claim 1 of manufacturing an LED module; by the LED module of claim 1.

According to the invention, the method of manufacturing an LED module comprises the steps of providing a translucent encapsulant comprising a number of layers to enclose a number of LEDs of the LED module; and modifying the surface structure of an outer surface of a layer to form at least one dense scattering region corresponding to the position of an LED of the LED module; to form at least one sparse scattering region that does not correspond to the position of an LED of the LED module; and to form a transition scattering region or gradient scattering region between a dense scattering region and a sparse scattering region.

An advantage of the inventive method is that the light output by a multi-LED module is given a homogenous appearance. This is achieved by the patterns formed on one or more surfaces of the translucent encapsulant. These patterns effectively comprise alterations in the otherwise smooth outer surface of a layer, for example a pattern can comprise an arrangement of nicks, dents, or burrs etc. formed on the layer surface. The changed texture achieves a desired optical scattering function at the surface of the translucent layer. The combination of a densely patterned region over an LED (i.e. aligned with the LED when looking into the light-emitting surface of the LED module) that transitions in all outward directions toward sparsely patterned regions means that an LED no longer appears as an "individual light source". Instead, the light from the LEDs is scattered to merge and blend, giving the appearance of a single light source, for example a single long and narrow light source in the case of an LED module comprising a strip of LEDs.

According to the invention, the LED module comprises a number of LEDs; a translucent encapsulant comprising a number of layers to enclose the LEDs; and a scattering pattern formed on the surface of at least one encapsulant layer to comprise at least one dense scattering region corresponding to the position of an LED of the LED module; to comprise at least one sparse scattering region that does not correspond to the position of an LED of the LED module; and to comprise a transition region between a dense scattering region and a sparse scattering region.

An advantage of the LED module according to the invention is that it can appear as single light source even if it comprises many LEDs. Furthermore, since the scattering of the light is effected at an outer surface of an encapsulant layer, without the need for embedding any scattering particles inside the encapsulant material, the encapsulant be made entirely of a flexible silicone. This in turn means that the LED module itself can be flexible, allowing the LED module to assume essentially any shape.

According to the invention, the device comprising a device housing and at least one such LED module arranged to emit light through an aperture in the device housing, and wherein a scattering pattern is formed on the surface of an encapsulant layer according to a desired degree of homogeneity of the light emitted by the LEDs of the LED module.

An advantage of the device according to the invention is that the LED module can provide a favourably homogenous light output, appearing as a single light source. Because the LED module can be made to assume essentially any form, the device can include such an LED module that has an unusual shape, or a shape that would otherwise not be possible using a prior art approach to achieve a homogenous light source effect.

The dependent claims and the following description disclose particularly advantageous embodiments and features of the invention. Features of the embodiments may be combined as appropriate. Features described in the context of one claim category can apply equally to another claim category.

In the following, without restricting the invention in any way, it may be assumed that the translucent encapsulant comprises a silicone material. The modified surface structure of an encapsulant layer can be achieved using any suitable technique. For example, a fine milling tool could be used to form a desired pattern in the surface of an encapsulant layer. Preferably, the extent of each scattering region and/or the density of each scattering region is determined on the basis of a desired optical appearance of the LED module during operation. The inventive method makes it possible to create a "fading" scattering pattern, i.e. a high-density pattern over or above an LED, fading to a low-density pattern with increasing distance outward from the LED (when looking onto the light-emitting surface of the LED module). In a particularly preferred embodiment of the invention, the scattering patterns are created by an infrared laser light beam. For example, a laser with a wavelength in the region of 10 µm can be used to create different pattern regions as desired. In this way, the optical properties of the encapsulant layer surface are altered or modified, for example by deliberately altering the layer surface morphology, by locally changing the refractive index, etc. The use of a laser such as an infrared laser allows essentially any scattering pattern to be formed on the surface of silicone can be realised, in a pattern freely chosen to suit the requirements of an application using that LED module.

The scattering pattern can be achieved by making randomly placed alterations in the surface of the layer, closer together or further apart, depending on whether a densely patterned region or a sparsely patterned region is being created. However, in a preferred embodiment of the invention, a scattering pattern comprises a regular formation of recesses in the surface of a layer. This allows more control over the actual level of scattering that will be achieved in the finished product. Preferably, a recess has an essentially circular shape and is created by directing a pulse of laser light at a specific point on the layer surface. Regardless of how the scattering patterns are created, the depth of a scattering pattern is preferably relatively shallow. Preferably, a recess formed at an outer surface of a layer is no deeper than 50 µm-200 µm.

Using a laser allows fine control over the pattern that is created. For example, in a preferred embodiment of the invention the surface structure of a layer is modified to form a two-dimensional grid pattern. The grid pattern can comprise tiny dents or recesses formed at predefined distances to each other in order to achieve the desired pattern density. Another advantage of using a laser to form the scattering pattern is that the high degree of precision and control can be applied to form scattering regions to show a specific image, for example a company logo or brand name, in the on-state and/or off-state of the LED module.

The scattering patterns may be formed only on the outermost surface of the encapsulant. This can be sufficient to achieve a desired scattering effect and a favourably homogenous light output appearance. In a further preferred embodiment of the invention, scattering patterns may be formed on the outermost surface of the encapsulant and also at an intermediate level. This is easily achieved when the encapsulant comprises two or more layers, for example a lower layer with an unmodified or smooth surface, applied directly over the LEDs, and a further layer applied on top of the lower layer. This outer layer can be treated to form scattering patterns on its lower surface (which will contact the outer surface of the lower layer) as well as on its upper surface (which is the outermost surface of the encapsulant). Such a two-sided patterned layer can exhibit angle-dependent effects, for example to change the degree of homogeneity of the light source as the viewing angle changes, to make an image or logo appear or disappear as the viewing angle changes, etc.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
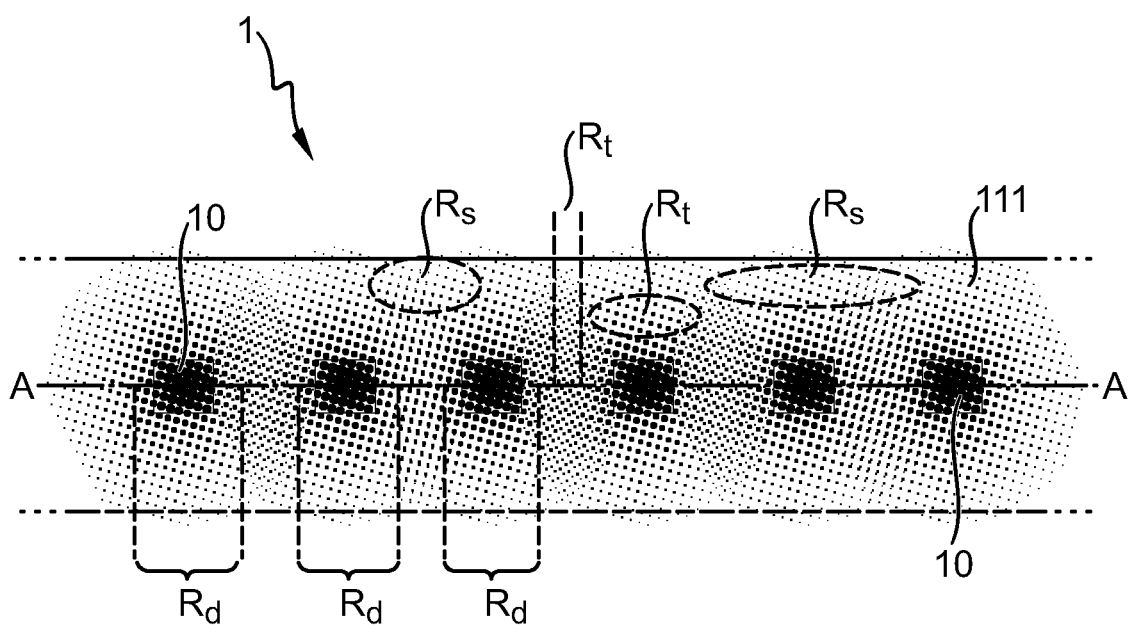
FIG. 1 shows a schematic representation of a view onto the light output surface of a first embodiment of the LED module according to the invention.

FIG. 1 shows a schematic representation of a view onto the light output surface 111 of an LED module 1 according to the invention. The LED module 1 comprises a series of LEDs 10 arranged in series on a carrier (not shown). The LEDs 10 are spaced apart by a certain pitch P. In this exemplary embodiment, the light output surface 111 is the uppermost surface 111 of a translucent encapsulant 11. The diagram indicates the outline of the LED dies 10 as seen through the transparent encapsulant. Scattering patterns $P_d$, $P_s$, $P_t$ with different densities have been formed in specific regions $R_d$, $R_s$, $R_t$ of the uppermost surface 111 to a depth of a few microns. The diagram schematically indicates the different pattern densities in the different regions $R_d$, $R_s$, $R_t$. Directly over an LED 10 and extending beyond the contours of the LED die, the scattering pattern $P_d$ is dense. At the outer regions of the module's light output surface, the scattering pattern $P_s$ is sparse. Between these regions, a transition scattering pattern $P_t$ has intermediate densities to achieve a smooth transition between regions, for example from a densely patterned region $R_d$ to a sparsely patterned region $R_s$.

Figure 2:
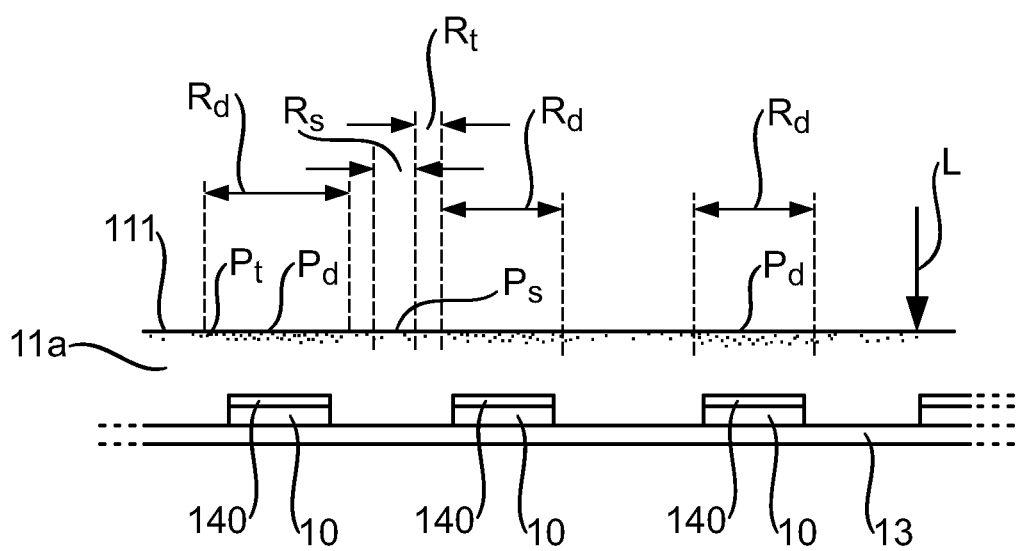
FIG. 2 is a cross-section through the LED module of FIG. 1.

FIG. 2 is a cross-section A-A through an LED module 1 similar to that of of FIG. 1. The diagram shows that the LED module 1 comprises a series of LEDs 10, each coated with a phosphor layer 140 and mounted onto a carrier 13. For example, the LEDs 10 can be soldered in a reflow process onto a flexible printed circuit board (PCB) 13. A liquid silicone mixture is then poured onto the PCB to cover the LEDs 10, and then cured in the usual manner to become a translucent encapsulant 11. In this exemplary embodiment, the translucent encapsulant 11 comprises a single layer 11a with an uppermost surface 111 through which the LED light will be emitted. Once the silicone encapsulant 11 has cured, the inventive method is applied, for instance by directing a laser beam L at regions $R_d$, $R_s$, $R_t$ of the uppermost surface 111 in a controlled manner to form the desired scattering patterns $P_d$, $P_s$, $P_t$. The encapsulant layer 11 is usually at least several millimetres thick, and can have a thickness of up to 10 mm, and the scattering patterns $P_d$, $P_s$, $P_t$ can be formed to a depth of 1-50 µm, typically to a depth of about 15 µm, by the infrared laser over the entire upper surface of the encapsulant layer 11a, i.e. over the entire light output surface of the LED module 1. The depth of the recesses or pits of the scattering pattern will depend to a large extent on the laser power. In this exemplary embodiment, dense pattern regions can be allocated over each LED, with transition regions bordering the dense regions, and with sparse patterning in between. This might be appropriate if, for example, the LED pitch is very large. Otherwise, the sparse pattern regions may be limited to the outer edges of the surface 111, as indicated in FIG. 1.

Figure 3:
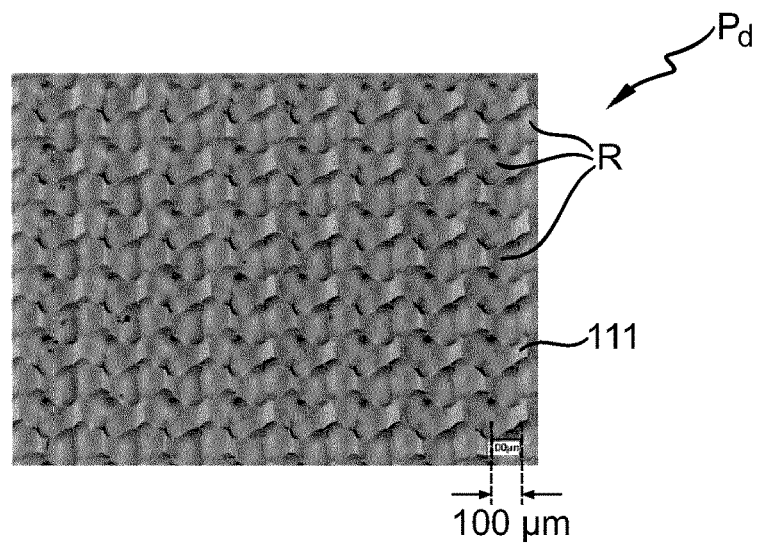
FIG. 3 shows a dense scattering pattern formed in an outer surface of an encapsulant layer.

FIG. 3 shows a dense scattering pattern formed by a $CO_2$ infrared laser in an outer surface of an encapsulant layer. The diagram shows a two-dimensional ordered pattern of recesses R or pits formed very close together and partially overlapping. In this dense scattering pattern $P_d$, very little of the original surface area of the encapsulant layer is left unaltered. In the method according to the invention, such a dense scattering pattern $P_d$ is formed in a region that is directly over an LED 10 and somewhat larger than the LED.

Figure 4:
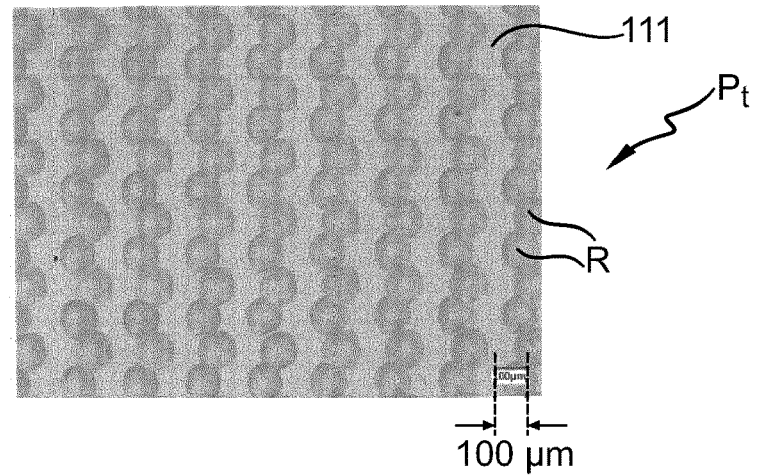
FIG. 4 shows a sparse scattering pattern formed in an outer surface of an encapsulant layer.

FIG. 4 shows a transition scattering pattern $P_t$ in which less of the original surface 111 of the encapsulant layer is treated, and in which the recesses R and/or pits are not as close together as in the dense scattering pattern of FIG. 3. In the method according to the invention, such a transition scattering pattern $P_t$ can be formed in any region that receives an amount of light that is significant but less than the amount of light received in a densely patterned region. The purpose of the transition scattering pattern $P_t$ is to achieve a more homogenous light output over the entire light output surface by "blending" the high light output regions $R_d$ into the low light output regions $R_s$.

Figure 5:
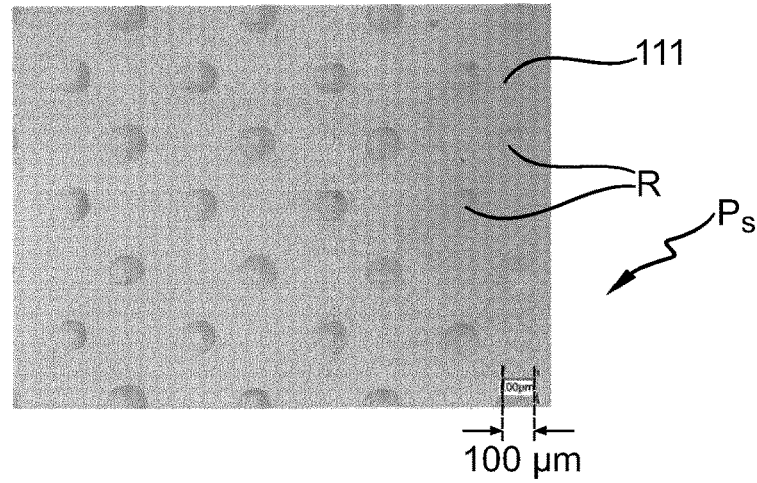
FIG. 5 shows a transition scattering pattern formed in an outer surface of an encapsulant layer.

FIG. 5 shows a sparse scattering pattern $P_s$ in which relatively large portions of the original surface 111 of the encapsulant layer are left unaltered, and in which the recesses and/or pits R are spaced widely apart. In the method according to the invention, such a sparse scattering pattern $P_s$ is formed in a region that receives little light directly from the LEDs, for example towards the outer edges of the light output surface 111 of the LED module and/or halfway between two neighbouring LEDs that are spaced apart by a relatively large pitch.

The recesses, pits or incisions R made into the surface of the encapsulant layer need not follow only a strict grid pattern as shown in FIGS. 3-5. Instead, variations in the placement of the recesses, pits or incisions R can be planned so that the resulting scattering pattern arrangement yields a recognisable image such as a company logo, a cartoon figure, a brand name, one or more words, etc.

Figure 6:
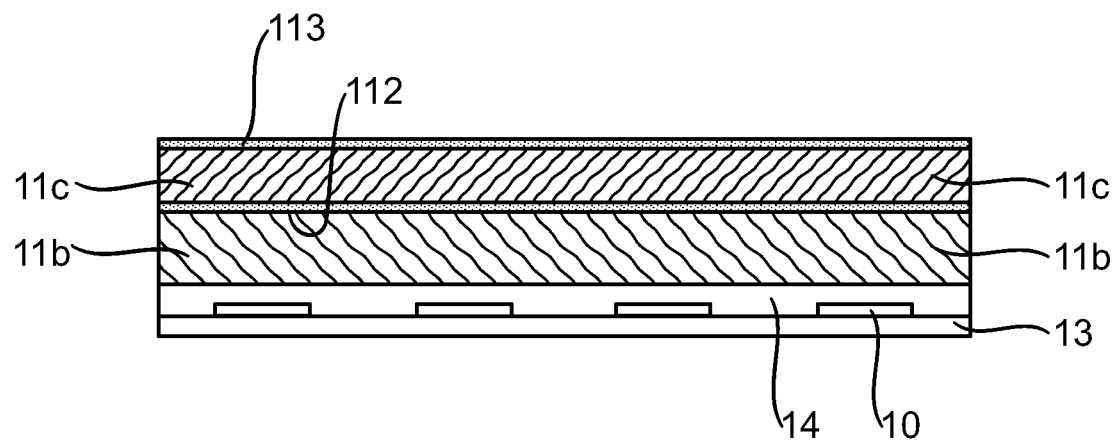
FIG. 6 is a cross-section through a second embodiment of an LED module according to the invention.
Figure 7:
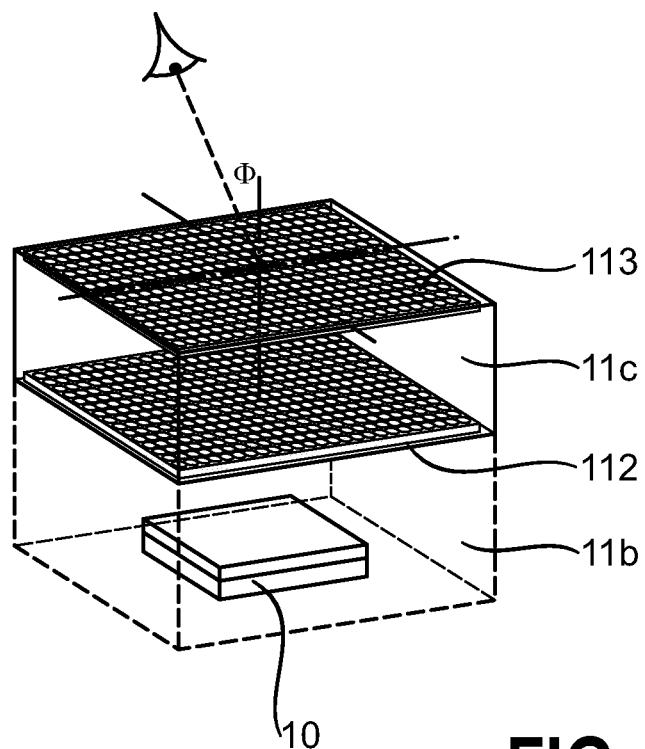
FIG. 7 shows a doubly-patterned encapsulant layer for an LED module according to the invention.

FIG. 6 is a cross-section through a second embodiment of an LED module 1 according to the invention, showing a translucent encapsulant 11 comprising two encapsulant layers 11b, 11c. The diagram also shows a phosphor layer 14 applied to completely cover the LEDs 10. The lower encapsulant layer 11b is untreated, e.g. it simply comprises a cured layer 11b of transparent silicone. The upper encapsulant layer 11c is patterned on both outer surfaces 112, 113. The effect of the double-sided patterning is to intensify the optical effect of the inventive patterning, as illustrated in FIG. 7, which shows the encapsulant layer 11c patterned on both outer surfaces 112, 113. When these two layers with certain optical patterns are carefully aligned, an angle-dependent distribution pattern can be realised. Here, the two-layered encapsulant 11b, 11c can have a total thickness of a few millimetres, e.g. up to 10 mm. The scattering patterns $P_d$, $P_s$, $P_t$ formed on the upper and lower surfaces 112, 113 of the upper encapsulant layer 11c can be formed to a depth of a few m as described above. This patterning depth is indicated by the containing rectangle in the diagram. In reality, any pattern will comprise an arrangement of recesses or pits in the surfaces 112, 113 of the upper encapsulant layer 11c.

Figure 8:
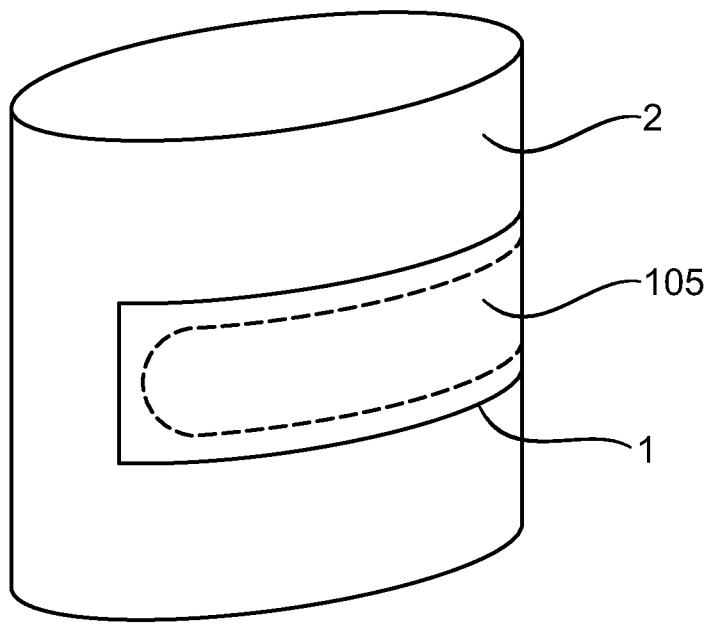
FIG. 8 shows a further embodiment of the LED module according to the invention.
Figure 9:
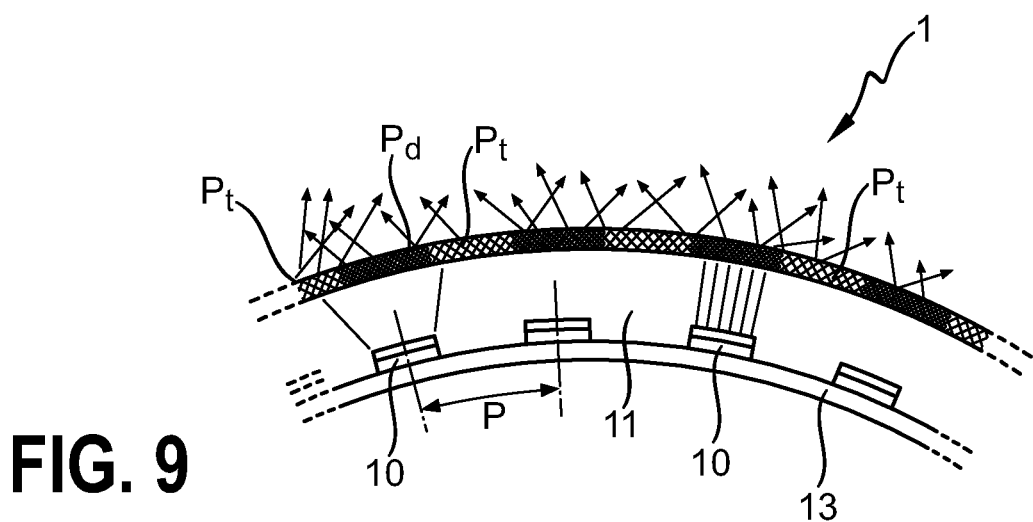
FIG. 9 shows a cross-section through the LED module of FIG. 8.

FIG. 8 shows a further embodiment of the LED module 1 according to the invention. Here, the LED module 1 is part of a lighting arrangement 2 and comprises several LEDs in curved configuration. During the on-state of the LED module 1, the light appears to originate from a single light source 105. The homogenous light output is achieved by the arrangement of patterned scattering regions as described in FIGS. 1-7 above. This effect is also illustrated in FIG. 9, which shows that any ray of light leaving an LED 10 in an essentially perpendicular direction is scattered to a greater extent by the dense scattering pattern $P_d$ of a densely pattered region $R_d$, while any ray of light exiting the encapsulant 11 somewhere at its outer edges or midway between LEDs 10 is scattered to a lesser extent by a transition pattern $P_t$ or a sparse pattern $P_s$. The arrangement of different scattering regions effectively cancels out the characteristic pitch-related "spottiness" of a strip of LEDs. The apparent light source 105 therefore appears as a single light source, and also has a higher light output than a conventional LED module that uses a metal oxide pigment in the encapsulant to scatter the light. Furthermore, the inventive LED module 1 can assume essentially any shape since the transparent encapsulant layer 11 retains its inherent flexibility.

Figure 10:
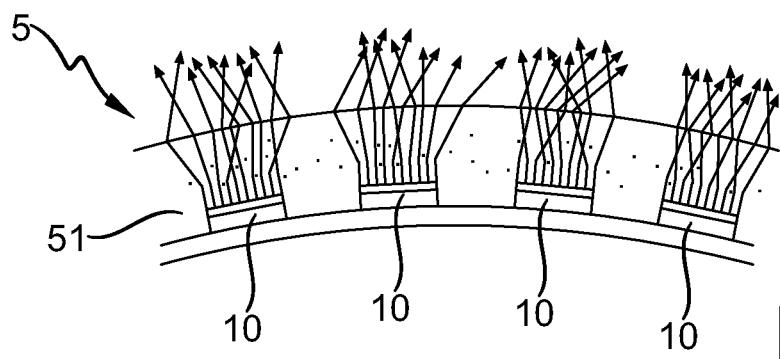
FIG. 10 shows a prior art LED module.

FIG. 10 shows a prior art LED module 5 in a similar lighting arrangement. A metal oxide pigment has been distributed in the encapsulant 51 in order to scatter the light with the aim of reducing the "spottiness" of the light output by the LED module 5. However, the metal oxide pigment in the encapsulant is insufficient to achieve a homogenous light appearance, and the separate light sources are clearly visible on account of the pitch P between neighbouring LEDs 10 and the brightness of the individual LEDs 10. The diagram shows that the rays of light leaving an LED 10 are scattered to a certain extent. To completely eliminate the "spottiness" of the LED module, a large quantity of metal oxide pigment would be required in the encapsulant 51, which would have the negative effects of severely reducing the light output of the LED module 5, and robbing the encapsulant of its flexible properties.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

REFERENCE SIGNS

1 LED module
10 LED
105 apparent light source
11 translucent encapsulant
11*a*, 11*b*, 11*c* translucent encapsulant layer
111, 112, 113 layer surface
13 carrier
14 phosphor layer
140 phosphor layer
2 device
5 prior art LED module
51 encapsulant
$R_d$ dense scattering region
$R_s$ sparse scattering region
$R_t$ transition scattering region
$P_d$ dense scattering pattern
$P_s$ sparse scattering pattern
$P_t$ transition scattering pattern
L laser light beam
R recess/pit
P pitch

The invention claimed is:

1. A flexible LED module comprising:
a plurality of LEDs;
a translucent flexible encapsulant comprising a plurality of layers to enclose the plurality of LEDs; and
a scattering pattern formed on the surface of at least one of the plurality of layers to comprise at least one dense scattering region corresponding to the position of one of the plurality of LEDs of the LED module; to comprise at least one sparse scattering region that does not correspond to the position of one of the plurality of LEDs of the LED module; and to comprise a transition region between a dense scattering region and the at least one sparse scattering region
wherein the translucent encapsulant comprises an inner layer applied onto the LED module, and a patterned layer applied onto the inner layer, and
wherein the patterned layer comprises a further scattering pattern on an inner surface adjoining the inner layer.

2. The flexible LED module according to claim 1, wherein the translucent encapsulant comprises the patterned layer with the scattering pattern on the outermost surface of the translucent encapsulant.

3. The flexible LED module according to claim 1, wherein the scattering pattern comprises a regular formation of recesses in the surface of the patterned layer.

4. The flexible LED module according to claim 3, wherein the recesses have an essentially circular shape.

* * * * *